United States Patent
Choi (10) Patent No.: US 11,616,205 B2
(45) Date of Patent: Mar. 28, 2023

(54) FLEXIBLE DISPLAY APPARATUS HAVING CUSHIONS OF DOT SHAPE FORMED ON A SURFACE OF A FLEXIBLE DISPLAY PANEL

(71) Applicant: Samsung Display Co., Ltd., Yongin-si (KR)

(72) Inventor: Dongwook Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/459,331

(22) Filed: Jul. 1, 2019

(65) Prior Publication Data

US 2019/0326531 A1    Oct. 24, 2019

Related U.S. Application Data

(62) Division of application No. 15/353,463, filed on Nov. 16, 2016, now abandoned.

(30) Foreign Application Priority Data

Nov. 17, 2015   (KR) .................. 10-2015-0161210

(51) Int. Cl.
*H01L 51/00*     (2006.01)
*H01L 51/52*     (2006.01)
*H01L 27/32*     (2006.01)

(52) U.S. Cl.
CPC .......... *H01L 51/0097* (2013.01); *H01L 27/32* (2013.01); *H01L 51/5253* (2013.01); *H01L 2251/5338* (2013.01); *Y02E 10/549* (2013.01)

(58) Field of Classification Search
CPC .................................................. H01L 51/0097
See application file for complete search history.

(56) References Cited

U.S. PATENT DOCUMENTS

| 8,009,421 | B2 | 8/2011 | Misawa |
| 9,337,434 | B2 | 5/2016 | Lindblad |
| 9,510,470 | B2 | 11/2016 | Huitema et al. |
| 9,743,537 | B2* | 8/2017 | Kim ..................... H05K 5/0017 |
| 10,056,575 | B2* | 8/2018 | Kim ..................... H01L 27/3244 |
| 10,162,387 | B2* | 12/2018 | Takayanagi ........... G06F 1/1679 |
| 10,263,216 | B2* | 4/2019 | Koo .................. G02F 1/133345 |
| 2006/0007368 | A1 | 1/2006 | Slikkerveer et al. |
| 2007/0188986 | A1 | 8/2007 | Kobayashi |
| 2008/0055831 | A1* | 3/2008 | Satoh ................... H05K 1/0281 361/600 |
| 2008/0212271 | A1 | 9/2008 | Misawa |
| 2009/0239320 | A1* | 9/2009 | Takayama ............... H01L 33/44 156/247 |

(Continued)

FOREIGN PATENT DOCUMENTS

| JP | 2006-91900 A | 4/2006 |
| JP | 2008-157996 A | 7/2008 |

(Continued)

*Primary Examiner* — Anh D Mai
(74) *Attorney, Agent, or Firm* — Lewis Roca Rothgerber Christie LLP (57) ABSTRACT

A flexible display apparatus includes a flexible display panel configured to wind around a winding axis unit, and a cushion unit arranged on the flexible display panel, wherein the cushion unit is arranged on a surface of the flexible display panel facing a circumferential surface of the winding axis unit.

5 Claims, 10 Drawing Sheets

(56) References Cited

U.S. PATENT DOCUMENTS

| | | | |
|---|---|---|---|
| 2010/0238612 A1* | 9/2010 | Hsiao | G09F 9/301 |
| | | | 361/679.01 |
| 2012/0204453 A1 | 8/2012 | Jung | |
| 2013/0002133 A1 | 1/2013 | Jin et al. | |
| 2013/0127799 A1 | 5/2013 | Lee | |
| 2015/0227171 A1 | 8/2015 | Choi et al. | |
| 2015/0325804 A1 | 11/2015 | Lindblad | |
| 2015/0378391 A1* | 12/2015 | Huitema | G06F 1/163 |
| | | | 361/679.03 |

FOREIGN PATENT DOCUMENTS

| | | |
|---|---|---|
| KR | 10-2005-0085090 A | 8/2005 |
| KR | 10-2012-0093665 A | 8/2012 |
| KR | 10-2013-0055263 A | 5/2013 |
| KR | 10-2014-0101124 A | 8/2014 |
| KR | 10-2015-0095075 A | 8/2015 |
| WO | WO 2015/100404 A1 | 7/2015 |

* cited by examiner

FLEXIBLE DISPLAY APPARATUS HAVING CUSHIONS OF DOT SHAPE FORMED ON A SURFACE OF A FLEXIBLE DISPLAY PANEL

CROSS-REFERENCE TO RELATED APPLICATION

This application is a divisional of U.S. patent application Ser. No. 15/353,463, filed Nov. 16, 2016, which claims priority to and the benefit of Korean Patent Application No. 10-2015-0161210, filed on Nov. 17, 2015, in the Korean Intellectual Property Office, the disclosures of all of which are incorporated herein in its entirety by reference.

BACKGROUND

1. Field

Aspects of the present inventive concept relate to a flexible display device.

2. Description of the Related Art

Generally, a display device may be used in a mobile apparatus, such as a smart phone, a digital camera, a camcorder, a portable information terminal, and a tablet personal computer (PC), an electronic apparatus, such as a desktop computer, a television, a billboard, an exhibition display apparatus and/or the like.

Recently, slimmer display devices have been released in the market. Flexible display devices are easy to carry and may also be applied to various apparatuses. Among flexible display devices, those using organic light-emitting display technology have gained attention as next generation display devices.

SUMMARY

Aspects of one or more embodiments of the present inventive concept are directed to a flexible display apparatus with improved winding and spreading.

Additional aspects will be set forth in part in the description which follows and, in part, will be apparent from the description, or may be learned by practice of the presented embodiments.

According to one or more embodiments of the present inventive concept, there is provided a flexible display apparatus including: a flexible display panel configured to wind around a winding axis unit; and a cushion unit arranged on the flexible display panel, wherein the cushion unit is arranged on a surface of the flexible display panel facing a circumferential surface of the winding axis unit.

In an embodiment, the flexible display panel has a first surface, on which a display unit is arranged and which is on an outside of the flexible display panel with respect to the circumferential surface of the winding axis unit, and a second surface opposite to the first surface and on an inside of the flexible display panel with respect to the circumferential surface of the winding axis unit; and the cushion unit is on the second surface of the flexible display panel.

In an embodiment, the cushion unit includes a plurality of cushions on the flexible display panel in a lengthwise direction corresponding to a winding direction of the flexible display panel, and wherein the plurality of cushions are spaced from each other in the lengthwise direction.

In an embodiment, each of the cushions extends in a widthwise direction of the flexible display panel, the widthwise direction intersecting the winding direction of the flexible display panel.

In an embodiment, a cushion of the cushions has a stripe shape.

In an embodiment, a cross-section of the cushion becomes narrower as a distance from a bottom surface of the cushion contacting the second surface of the flexible display panel increases.

In an embodiment, the bottom surface of the cushion is larger than other parallel cross-sections of the cushion, and a top surface of the cushion is smaller than other parallel cross-sections of the cushion.

In an embodiment, edges of adjacent cushions of the cushions contact each other.

In an embodiment, the flexible display panel includes an active area extending in a lengthwise direction of the flexible display panel and on which a display unit is arranged, and an inactive area extending in a widthwise direction of the flexible display panel and outside the active area of the flexible display panel; and each of the cushions is arranged across the active area and the inactive area of the flexible display panel.

In an embodiment, each of the cushions has a dot shape.

In an embodiment, the flexible display panel includes an active area extending in a lengthwise direction of the flexible display panel and on which a display unit is arranged, and an inactive area extending in a widthwise direction of the flexible display panel and outside the active area of the flexible display panel; and the cushions are in the inactive area of the flexible display panel and are spaced from each other in the inactive area of the flexible display panel.

In an embodiment, the cushion unit is on the second surface of the flexible display panel corresponding to a length of the flexible display panel, the length of the flexible display panel being equivalent to a circumference of the winding axis unit.

In an embodiment, the cushion unit includes a foam type insulation tape.

In an embodiment, an adhesive is between the cushion unit and the flexible display panel.

In an embodiment, the winding axis unit includes a fixing portion, and an end of the flexible display panel is configured to be connected to the fixing portion of the winding axis unit.

In an embodiment, the end of the flexible display panel and the winding axis unit are configured to be connected to each other at a winding start portion of the flexible display panel.

In an embodiment, the winding axis unit is connected to the flexible display panel, and an end of the flexible display panel is bent.

In an embodiment, the flexible display panel is configured to wind around the winding axis unit in one direction, and the cushion unit is in a space between the flexible display panel and the circumferential surface of the winding axis unit.

In an embodiment, the cushion unit includes a plurality of cushions in a gap between portions of the flexible display panel around the winding axis unit.

In an embodiment, the flexible display panel includes: a display substrate; at least one thin film transistor (TFT) including a semiconductor active layer, a gate electrode, a source electrode, and a drain electrode that are on the display substrate; an organic light-emitting device electrically connected to the at least one TFT; and a thin film encapsulation layer configured to cover the display substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The present embodiments may have different forms and should not be construed as being limited to the descriptions set forth herein. Accordingly, the embodiments are merely described below, by referring to the figures, to explain aspects of the present description.

Reference will now be made in detail to embodiments of a flexible display apparatus, examples of which are illustrated in the accompanying drawings, wherein like reference numerals refer to like elements throughout.

Figure 1:
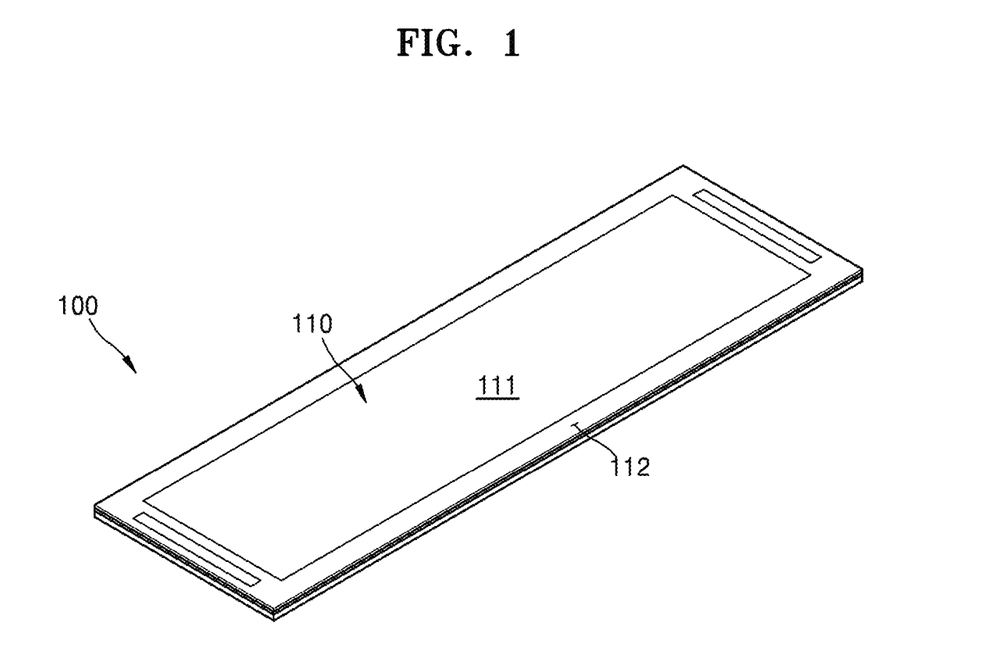
FIG. 1 is a perspective view illustrating a spread state of a flexible display device according to an embodiment of the present inventive concept.
Figure 2:
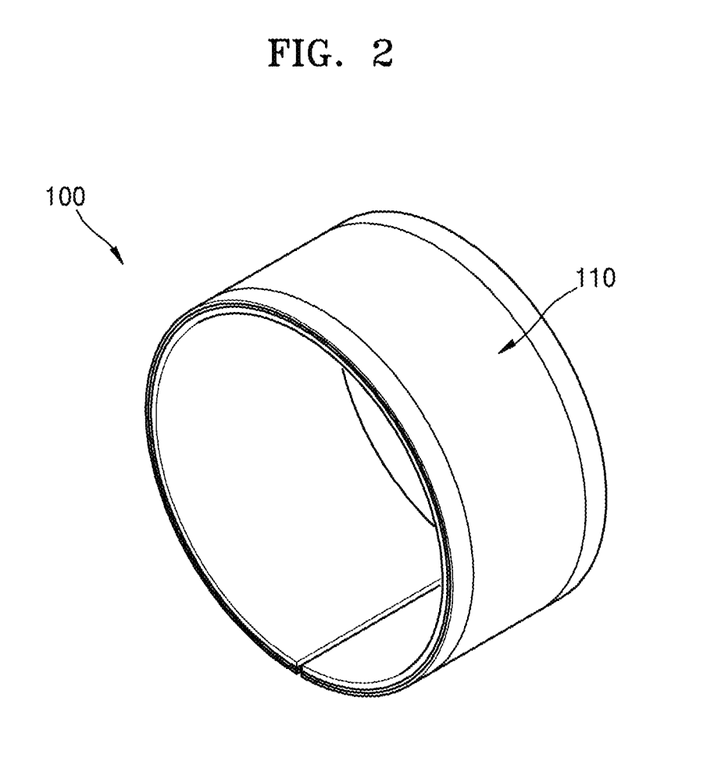
FIG. 2 is a perspective view illustrating a wound (rolled-up) state of the flexible display device of FIG. 1.

FIG. 1 is a perspective view illustrating a spread state of a flexible display device 100 according to an embodiment of the present inventive concept; and FIG. 2 is a perspective view illustrating a wound state of the flexible display device 100 of FIG. 1.

Referring to FIGS. 1 and 2, the flexible display device 100 includes a flexible display panel 110. The flexible display panel 110 includes an active area (AA) 111 and an inactive area (IAA) 112, which is extended from the active area 111 to an outside of the active area 111.

The display panel 110 may include a flexible display substrate and various films, for example, a touch screen, a polarizer, a cover window, and/or the like. The flexible display device 100 may be viewed from various angles when being in a spread state, a curved state, or a wound state, such as a cylindrical state.

In an embodiment, the flexible display panel 110 may be wound with respect to a winding axis unit.

Figure 3A:
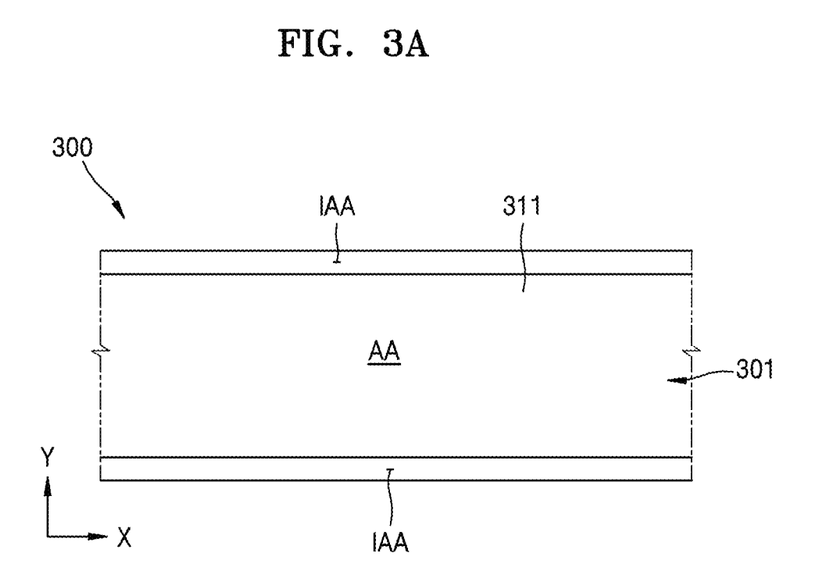
FIG. 3A is a plan view illustrating a front surface of a flexible display panel in a spread state according to another embodiment of the present inventive concept.
Figure 3B:
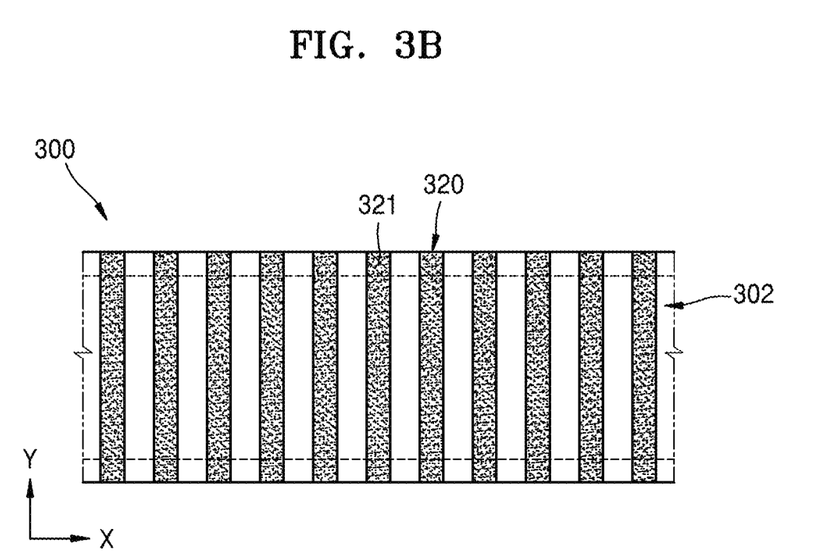
FIG. 3B is a bottom view of the flexible display panel of FIG. 3A.

FIG. 3A is a plan view illustrating a front surface of a flexible display panel 300 in a spread state according to another embodiment of the present inventive concept; and FIG. 3B is a bottom view of the flexible display panel 300 of FIG. 3A.

In an embodiment, the flexible display panel 300 may be a panel for an organic light-emitting display device, which will be explained as an example. However, the flexible display panel 300 may be a panel for a liquid crystal display (LCD), a panel for a field emission display (FED), or a panel for an electronic paper display (EDP), and/or the like.

In an embodiment, the flexible display panel 300 includes a flexible display substrate, at least one thin film transistor TFT, which is disposed on the flexible display substrate, a light-emitting element, which is connected to the thin film transistor TFT, and an encapsulation layer, which covers the flexible display substrate.

Referring to FIGS. 3A and 3B, the flexible display panel 300 includes a first surface 301 on which a display unit 311 is disposed to display an image, and a second surface 302, which is disposed opposite to the first surface 301.

In an embodiment, the flexible display panel 300 includes an active area AA and an inactive area IAA, which is disposed outside the active area AA. The active area AA may be extended in a lengthwise direction of the flexible display panel 300 (e.g., an X direction). The lengthwise direction of the flexible display panel 300 may correspond to a winding direction of the flexible display panel 300. The display unit 311 may be disposed in the active area AA.

The inactive area IAA may be disposed outside the active area AA in the widthwise direction of the flexible display panel 300. A widthwise direction) of the flexible display panel 300 (e.g., a Y direction) may correspond to a direction that intersects (e.g., is orthogonal to) the winding direction of the flexible display panel 300. In another embodiment, the inactive area IAA may be disposed on both ends of the flexible display panel 300 in the lengthwise direction of the flexible display panel 300.

In an embodiment, the flexible display panel 300 may be wound around a winding axis unit. An end of the flexible display panel 300 and the winding axis unit are connected to each other at a connection portion of the flexible display panel 300, which may protrude from the winding axis unit. When the flexible display panel 300 is wound, stress may be exerted on a protruding portion of the flexible display panel 300.

In order to reduce the stress exerted on the flexible display panel 300, a cushion unit 320 may be disposed on the flexible display panel 300. In detail, the cushion unit 320 may be disposed on the second surface of the flexible display panel 300. The second surface 302 of the flexible display panel 300, on which the cushion unit 320 is disposed, may be opposite to the first surface of the flexible display panel 300, on which the display unit 311 is disposed.

The cushion unit 320 includes a plurality of cushions 321.

The plurality of cushions 321 may be spaced apart from each other by intervals in the lengthwise direction of the flexible display panel 300 (e.g., the X direction), which corresponds to the winding direction of the flexible display panel 300.

Each of the cushions 321 as a unit cushion may be extended in the widthwise direction of the flexible display panel 300 (e.g., the Y direction), which corresponds to a direction that intersects (e.g., is orthogonal to) the winding direction of the flexible display panel 300. Each cushion 321 is disposed across the active layer AA, which is disposed on the first surface 301 of the flexible display panel 300, and is also disposed on the inactive area IAA, which is disposed outside the active area AA.

In an embodiment, each cushion 321 may be a stripe shape. While each cushion 321 shown in FIG. 3B has a structure that is disposed in the widthwise direction of the flexible display panel 300, the present inventive concept is not limited to a particular shape of the structure of the cushion 321.

The cushion unit 320 may include an elastic member, for example, a foam type of an insulation tape. The cushion unit 320 may include acryl, urethane, and/or the like.

In an embodiment, an adhesive layer may be disposed between the cushion unit 320 and the second surface 302 of the flexible display panel 300.

Figure 4A:
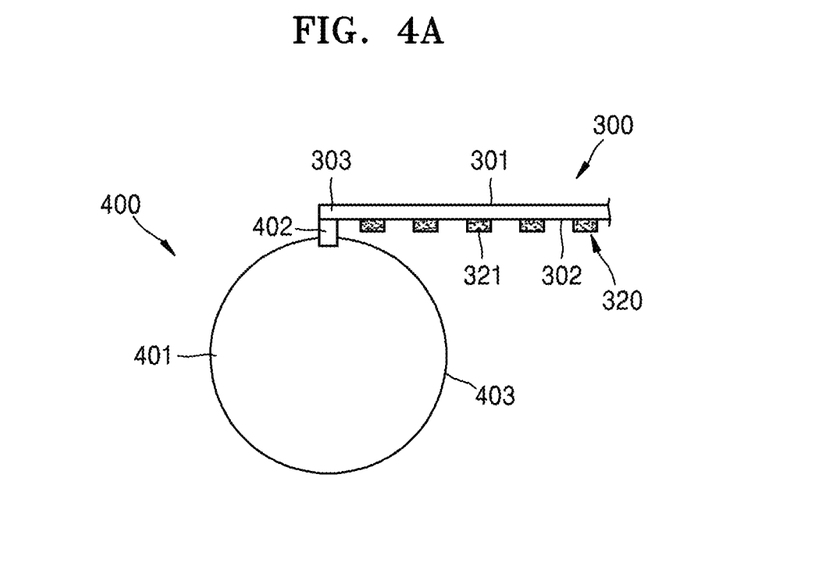
FIG. 4A is a view schematically illustrating the spread state of the flexible display panel of FIG. 3A.
Figure 4B:
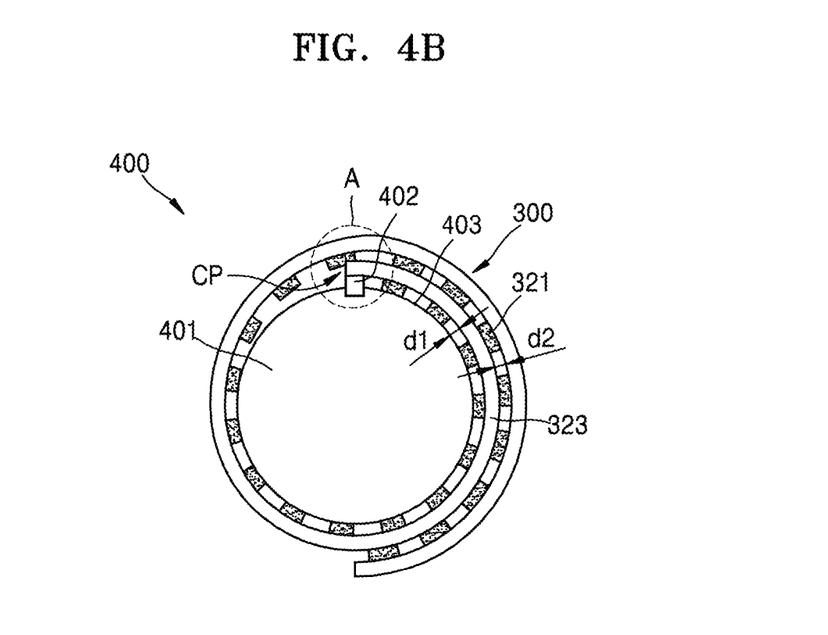
FIG. 4B is a view schematically illustrating a wound (rolled-up) state of the flexible display panel of FIG. 4A.

FIG. 4A is a view schematically illustrating a spread state of the flexible display panel 300 of FIG. 3A; and FIG. 4B is a view schematically illustrating a wound state in which the flexible display panel 300 of FIG. 4A winds around a winding axis unit 401.

Referring to FIGS. 4A and 4B, a flexible display device 400 includes the flexible display panel 300, which may wind around the winding axis unit 401.

The winding axis unit 401 may have a cylindrical shape. However, the winding axis unit 401 is not limited to such a structure, and any suitable structure that enables the flexible display panel 300 to be wound may be utilized. In another embodiment, the winding axis unit 401 may be formed to have a thickness by winding an end 303 of the flexible display panel 300. In an embodiment, if the fixing portion 402 is mounted on an exterior surface of the winding axis unit 401, the present disclosure is not limited to a particular structure of the fixing portion 402. In another embodiment, the fixing portion 402 may be disposed in a widthwise direction of the winding axis unit 401.

The end 303 of the flexible display panel 300 may be connected to the fixing portion 402. The end 303 of the flexible display panel 300 may be fixedly coupled to the fixing portion 402 in the widthwise direction of the winding axis unit 401. In an embodiment, a connection portion CP where the end 303 of the flexible display panel 300 and the fixing portion 402 are connected to each other may correspond to a winding start portion of the flexible display panel 300.

The end 303 of the flexible display panel 300 may be coupled to the fixing portion 402 by using a fixing element. A coupling method by using a fixing element may be various suitable coupling methods including an adhesive coupling method, a bolt coupling method, an inserting method, a hook coupling method, and/or the like.

The display unit 311 of FIG. 3A may be disposed on the first surface 301 of the flexible display panel 300. The first surface 301 of the flexible display panel 300 may correspond to an exterior area of the flexible display panel 300, which is disposed outside the flexible display panel 300 with respect to a circumferential surface 403 of the winding axis unit 401.

The cushion unit 320 may be disposed on the second surface 302 of the flexible display panel 300. The second surface 302 of the flexible display panel 300 may correspond to an interior area of the flexible display panel 300, which is disposed inside the flexible display panel 300 with respect to the circumferential surface 403 of the winding axis unit 401. The second surface 302 of the flexible display panel 300 may face the circumferential surface 403 of the winding axis unit 401.

The flexible display panel 300 may be wound around the winding axis unit 401 in a direction (e.g., a clockwise direction, as shown in FIG. 4A). The flexible display panel 300 may be wound around the winding axis unit 401 at least one lap (i.e., at least one time).

When the flexible display panel 300 winds around the winding axis unit 401, a step may exist in in the connection portion CP where the end 303 of the flexible display panel 300 and the fixing portion 402 of the winding axis unit 401 are connected to each other. Accordingly, the flexible display panel 300 may not be wound in a circular shape, and the stress may be exerted on the connection portion CP of the flexible display panel 300.

In an embodiment, the cushion unit 320 may be disposed on the second surface 302 of the flexible display panel 300 and may reduce the stress. The cushion unit 320 may include the plurality of cushions 321. The plurality of cushions 321 may be arranged in a space corresponding to a distance d1 between the flexible display panel 300 and the circumferential surface 403 of the winding axis unit 401.

In an embodiment, when the flexible display panel 300 is wound around the winding axis unit 401 several laps (i.e., several times), the plurality of cushions 321 are additionally disposed in a gap (corresponding to a distance d2) between portions of the flexible display panel 300, which are wound around the winding axis unit 401.

Figure 5:
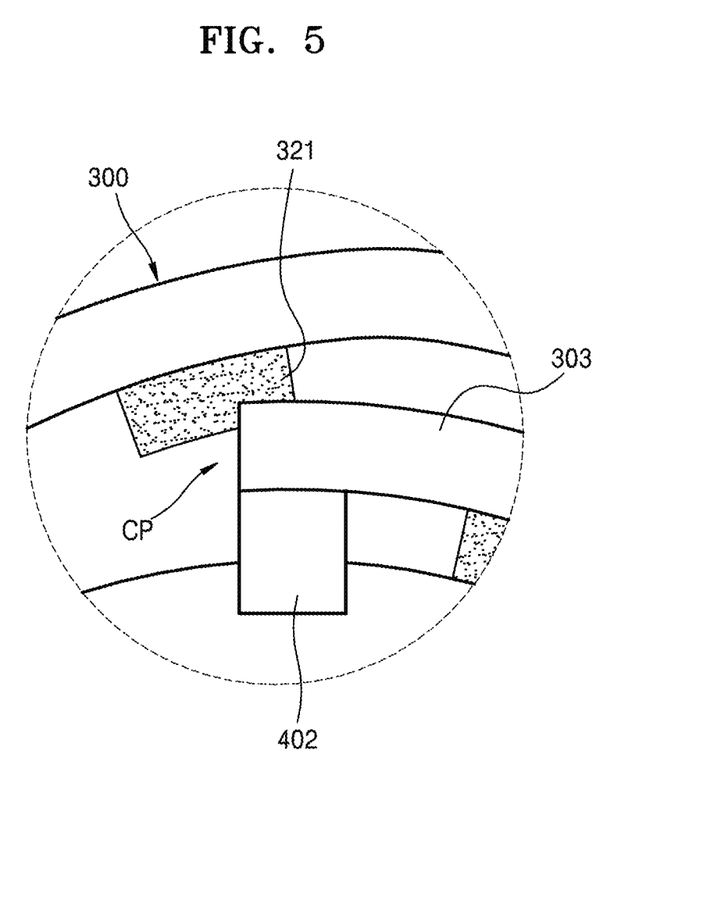
FIG. 5 is an enlarged view of a portion A of FIG. 4B.

When a portion of the flexible display panel 300 is disposed on the connection portion CP, the cushion 321 having an elastic characteristic may be compressed by the connection portion CP as illustrated in FIG. 5. Accordingly, the stress that is exerted on the flexible display panel 300 may be mitigated.

Figure 6A:
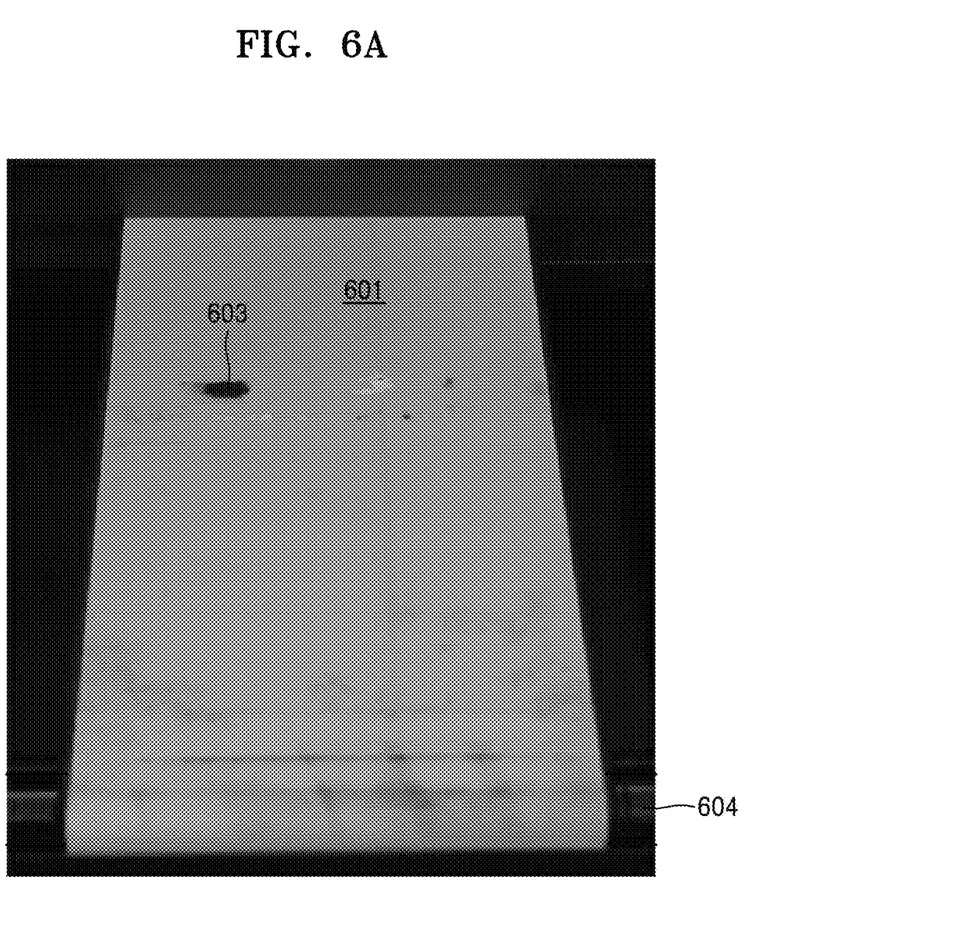
FIG. 6A is a view illustrating an experimental result of a flexible display panel as a comparison example.
Figure 6B:
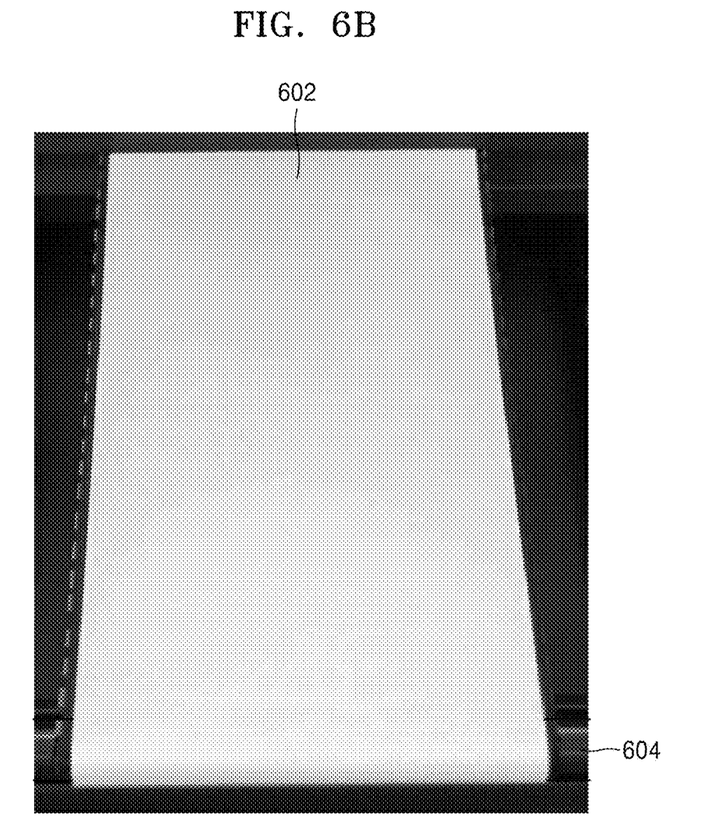
FIG. 6B is a view illustrating an experimental result of a flexible display panel according to an embodiment of the present inventive concept.

FIG. 6A is a view illustrating an experimental result of a flexible display panel 601 as a comparison sample, and FIG. 6B is a view illustrating an experimental result of a flexible display device 602 according to the present embodiment.

Table 1 shows experimental winding conditions of a flexible display panel.

TABLE 1

| Panel Size (inch) | Curvature (R) | Cycle |
| --- | --- | --- |
| 5.68 | 12 mm | 20,000 |

Here, the flexible display panel 601, as the comparison sample, does not have any cushion, and the flexible display panel 602 according to the present embodiment may have the cushion unit 320.

Referring to the Table 1, size of (e.g., length of) each of the flexible display panel 601, as the comparison sample, and the flexible display panel 602 according to the present embodiment is 5.68 inches (25.4 mm), each curvature thereof is 12 mm, and the number of rolling cycles thereof is 20,000.

Referring to FIGS. 6A and 6B, the flexible display panel 601 as the comparison sample shows stains 603 after 20,000 rolling cycles. A portion of the flexible display panel 601 in which the stains 603 are generated may correspond to a connection portion in which the flexible display panel 601 and a winding axis unit 604 are connected to each other.

Compared to FIG. 6A, the flexible display panel 602 according to the present embodiment does not show any stain (i.e., sign of strain) after 20,000 rolling cycles. Because the stress, which is exerted to the flexible display panel 300, is mitigated due to the presence of the cushion unit 320, the stain 603 is not generated on the flexible display panel 602.

Figure 7A:
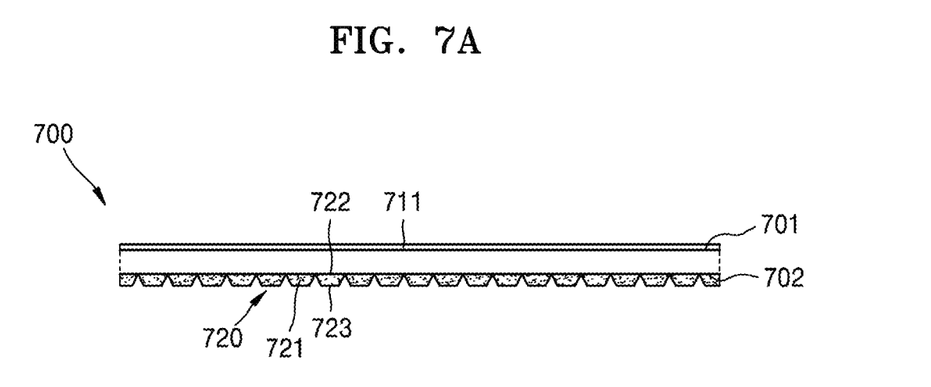
FIG. 7A is a side view illustrating a spread state of a flexible display panel according to yet another embodiment of the present inventive concept.
Figure 7B:
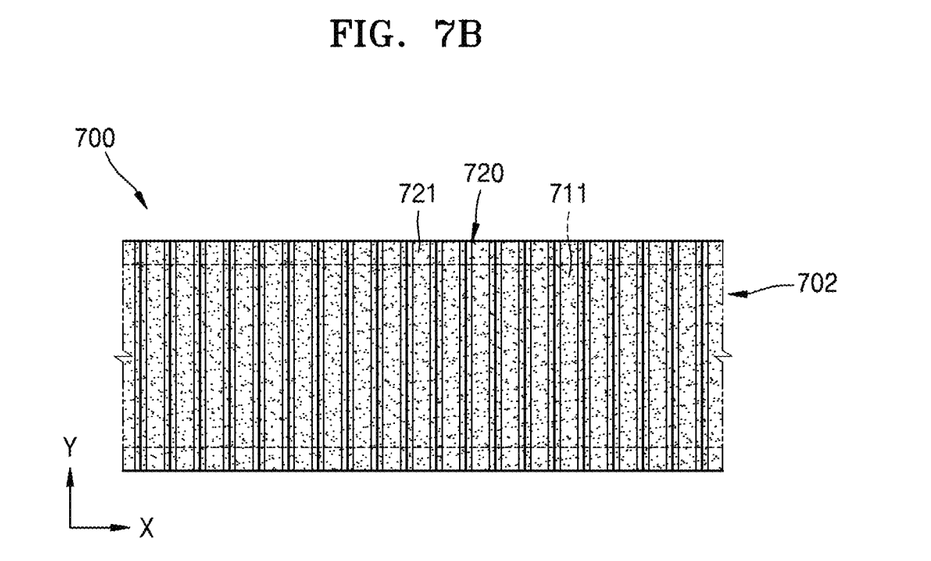
FIG. 7B is a bottom view of the flexible display panel of FIG. 7A.

FIG. 7A is a side view illustrating a spread state of a flexible display panel 700 according to another embodiment of the present inventive concept; FIG. 7B is a bottom view of the flexible display panel 700 of FIG. 7A; and FIG. 7C is an enlarged partial side view of the flexible display panel 700 of FIG. 7C.

Figure 7C:
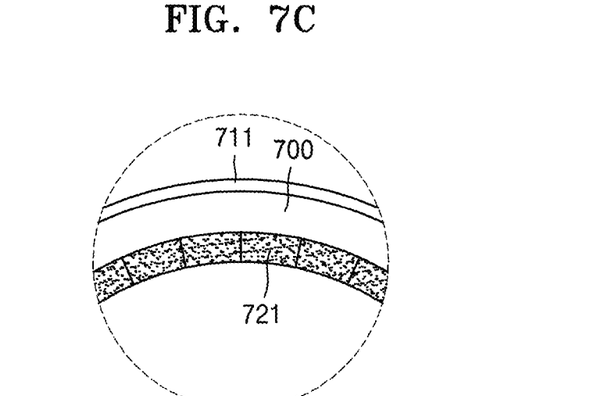
FIG. 7C is an enlarged partial side view of the flexible display panel of FIG. 7C.

Referring to FIGS. 7A, 7B, and 7C, a display unit may be disposed on a first surface 701 of the flexible display panel 700. A cushion unit 720 may be disposed on a second surface of the flexible display panel 700 that is opposite to the first surface 701 of the flexible display panel 700.

The cushion 720 includes a plurality of cushions 721. The plurality of cushions 721 may be disposed on the flexible display panel 700 and spaced apart from each other by intervals in a lengthwise direction of the flexible display panel 700 (e.g., the X direction), which corresponds to a winding direction of the flexible display panel 700.

Each of the cushions 721 as a unit cushion may be extended in a widthwise direction of the flexible display panel 700 (e.g., the Y direction), which intersects (e.g., is orthogonal to) the winding direction of the flexible display panel 700.

A shape of the cushion unit 720 may be different from a shape of the cushion unit 320 of FIG. 3B. For example, a cross-section of each cushion 721 becomes gradually narrower according to a distance from a bottom surface 722 of the cushion 721, which contacts the second surface 702 of the flexible display panel 700. In an embodiment, an area of the bottom surface 722 of the cushion 721 is larger than other parallel cross-sections of the cushion 721, and an area of an upper surface 723 of the cushion 721 is smaller than other parallel cross-sections of the cushion 721.

In an embodiment, each of the cushions 721 may be a trapezoid. Because the cushions 721 have inclined planes, the flexible display panel 700 may be easily wound in a circle.

While the cushions 721 shown in FIG. 7A have a structure in which the cross-section of each cushion 721 becomes gradually narrower according to the distance from the bottom surface 722 of the cushion 721, which contacts the second surface 702 of the flexible display panel 700, the present inventive concept is not limited to a particular shape of the structure of the cushion 721.

In another embodiment, a cross-section of the cushion 721 may be a partial circle. The cross-section of the cushion 721 may also be a triangle, rectangular, a polygon, and/or the like.

In another embodiment, the two adjacent cushions 721 may contact each other at edges of the two adjacent cushions 721, which face each other.

Figure 8A:
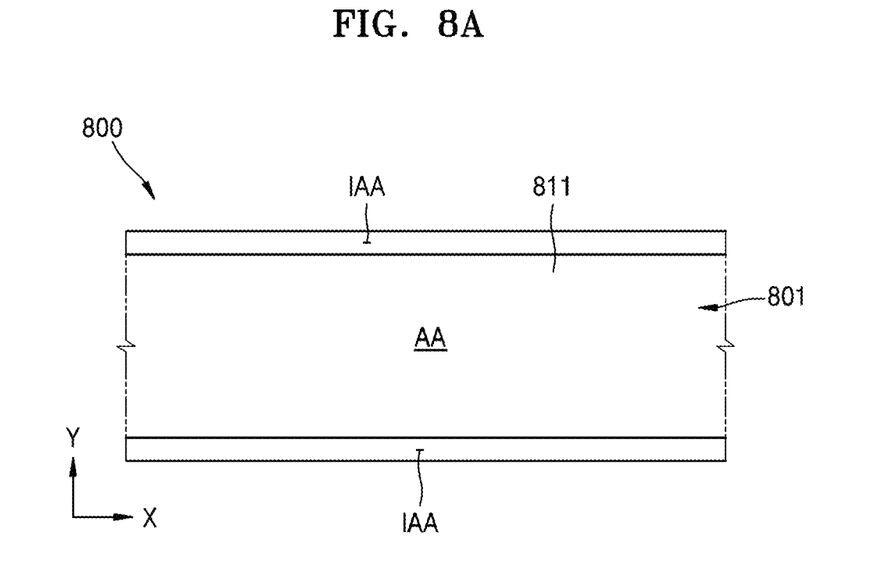
FIG. 8A is a plan view illustrating a front surface of a flexible display panel in a spread state according to another embodiment of the present inventive concept.
Figure 8B:
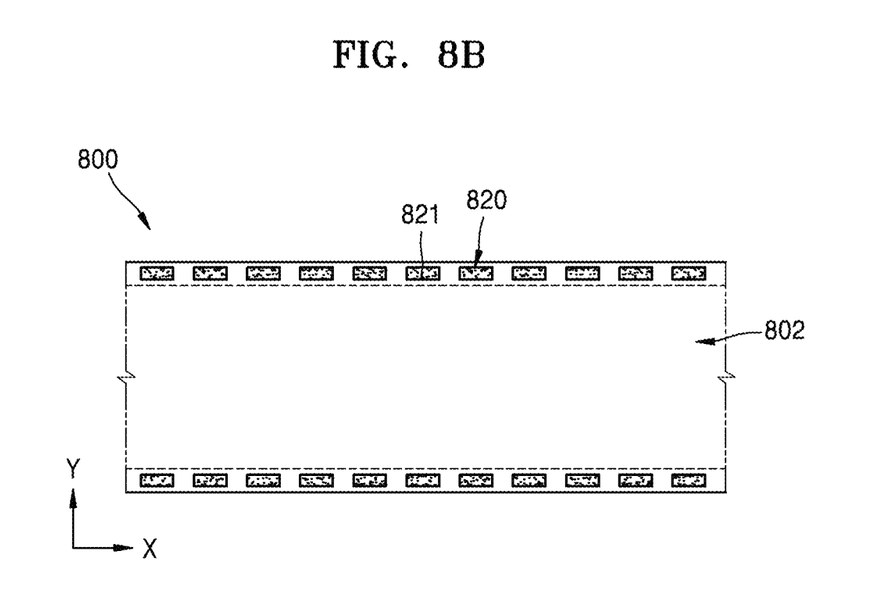
FIG. 8B is a bottom view of the flexible display panel of FIG. 8A.

FIG. 8A is a plan view illustrating a front side of a flexible display panel 800 in a spread state according to another embodiment of the present inventive concept; and FIG. 8B is a bottom view of the flexible display device 800 of FIG. 8A.

Referring to the drawings, the flexible display panel 800 includes a first surface 801 on which a display unit 811 is disposed, and a second surface 802 that is opposite to the first surface 801 of the flexible display panel 800. In an embodiment, the flexible display panel 800 includes an active area AA, in which the display unit 811 is disposed, and an inactive area IAA, which is disposed outside the active area AA.

A cushion unit 820 may be disposed on the flexible display panel 800. The cushion unit 820 may be disposed on the second surface 802 of the flexible display panel 800. The cushion unit 820 may include a plurality of cushions 821.

The plurality of cushions 821 may be spaced apart from each other by intervals in a lengthwise direction of the flexible display panel 800 (e.g., the X direction), which corresponds to a winding direction of the flexible display panel 800.

The cushion unit 820 may have a dot shape, which is different from a shape of the cushion unit 320 of FIG. 3B.

Each of the cushions 821 as a unit cushion may be disposed on both surfaces of the flexible display panel 800 in a widthwise direction of the flexible display panel 800 (e.g., the Y direction), may be disposed in the inactive area IAA of the flexible display panel 800, and may be spaced apart from each other by intervals.

Because the cushion unit 820 is disposed to correspond to the inactive area IAA, the cushion unit 820 may not cause any problems, such as pressing the active area AA in which the display unit 811 emits light.

Although the cushion unit 820 shown in FIG. 8B has a rectangular dot pattern as illustrated in FIG. 8B, the cushion unit 820 may have various suitable shapes including a circular dot shape, an elliptical dot shape, a polygon dot shape, and/or the like.

Figure 9A:
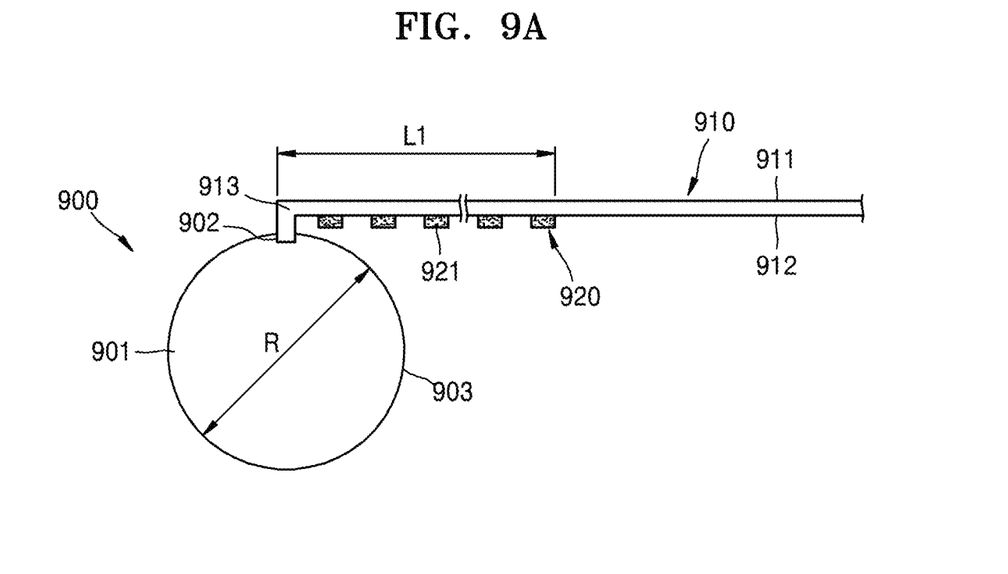
FIG. 9A is a view schematically illustrating a spread state of a flexible display device according to another embodiment of the present inventive concept.
Figure 9B:
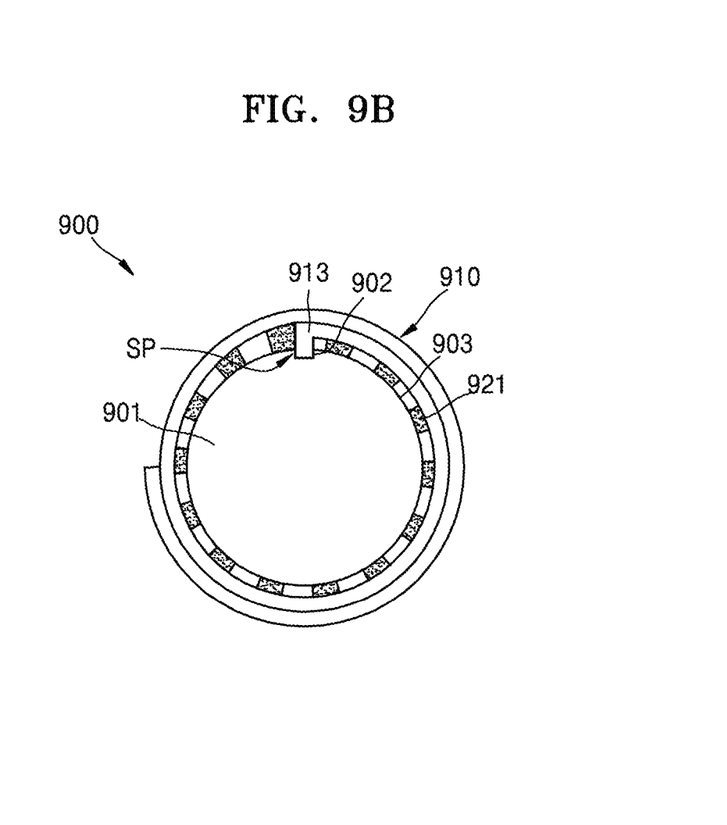
FIG. 9B is a view schematically illustrating a wound (rolled-up) state of the flexible display device of FIG. 9A.

FIG. 9A is a view schematically illustrating a spread state of a flexible display device 900 according to another embodiment of the present inventive concept; and FIG. 9B is a view schematically illustrating a wound state of the flexible display device 900 of FIG. 9A.

Referring to FIGS. 9A and 9B, the flexible display device 900 includes a flexible display panel 910, which winds around a winding axis unit 901. An end 913 of the flexible display panel 910 may be connected to the winding axis unit 901. In detail, the end 913 of the flexible display panel 910 may be fixed to the winding axis unit 901 by using a fixing mechanism.

In an embodiment, a coupling method using the fixing mechanisms may include forming a groove 902 having a set or predetermined depth in the winding axis unit 901 in a widthwise direction of the winding axis unit 901, and inserting the end 913 of the flexible display panel 910 into the groove 902, such that the end 913 of the flexible display panel 910 is fixed to the winding axis unit 901. The end 913 of the flexible display panel 910 may be bent by a set or predetermined angle with respect to a main portion of the flexible display panel 910.

In another embodiment, the flexible display panel 910 may be fixed to the winding axis unit 901 by using an adhesive, bolting, laser, a hook, and/or the like.

In another embodiment, a fixing unit may be installed at the winding axis unit 901 without forming the groove 902, and the fixing unit and the flexible display panel 910 may be connected to each other.

A display unit, for example, the display unit 111 of FIG. 3A, may be disposed on the first surface 911 of the flexible display panel 910. The cushion unit 920 may be disposed on the second surface 912 of the flexible display panel 910. The second surface 912 of the flexible display panel 910 may face a circumferential surface of the winding axis unit 901.

The cushion unit 920 according to the present embodiment may be different from the cushion unit 320 of FIG. 4B and may be disposed on an area of the second surface 912 of the flexible display panel 910 that corresponds to a length L1 of one lap of the flexible display panel 910 winding around the winding axis unit 901.

In detail, the cushion unit 920 may include a plurality of cushions 921.

The plurality of cushions 921 may be spaced apart from each other by intervals in a winding direction of the flexible display panel 910. The plurality of cushions 921 may be selectively disposed in the area of the flexible display panel 910, which corresponds to the length, that is, $2\pi R$ or L1, of the one lap of the flexible display panel 910 that winds around the circumferential surface 903 of the winding axis unit 901. After the flexible display panel 910 winds around the circumferential surface 903 of the winding axis unit 901 by one lap, other areas of the flexible display panel 910 are less affected by a step portion SP even without the cushion unit 920.

Figure 10:
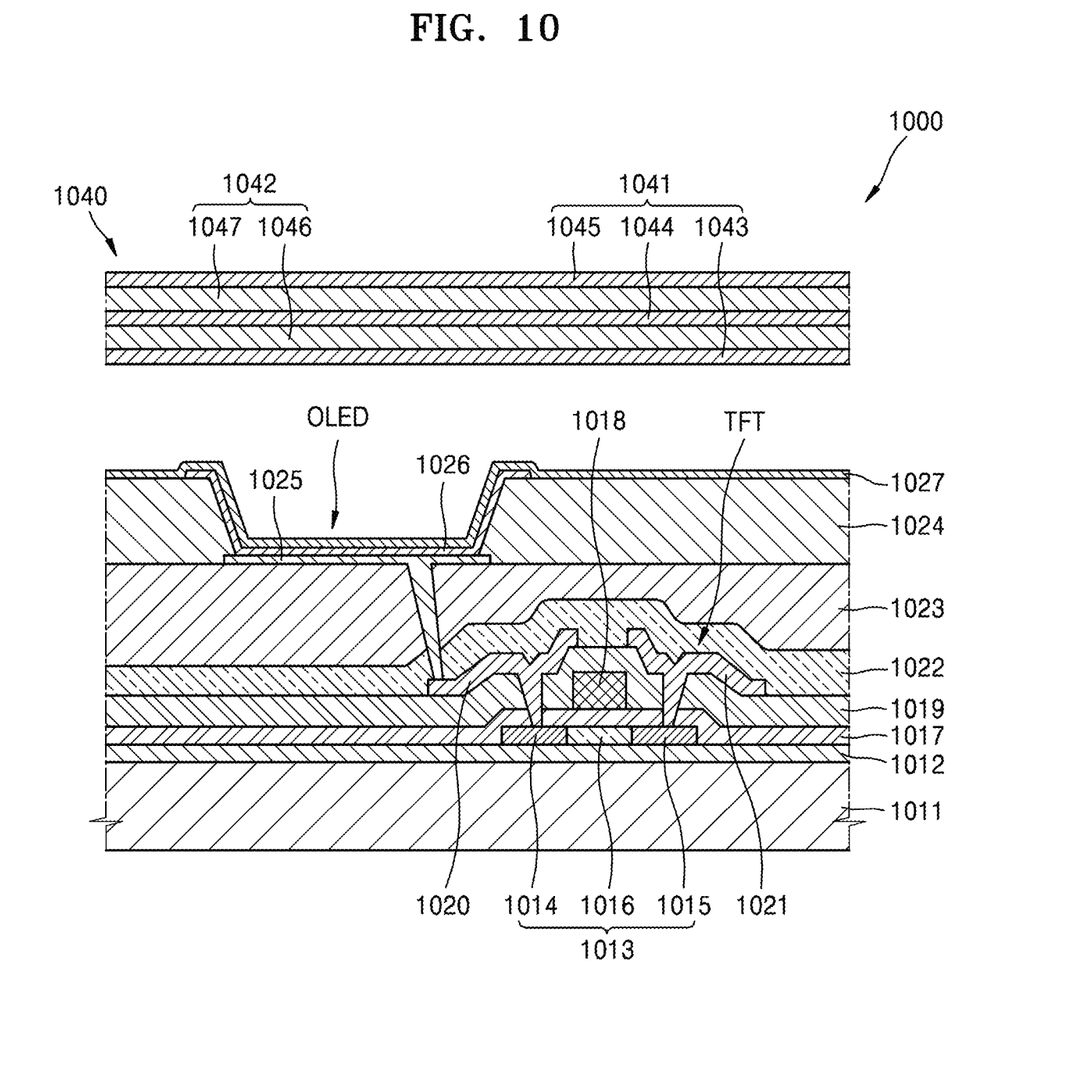
FIG. 10 is a cross-sectional view of a sub-pixel of an organic light-emitting device according to an embodiment of the present inventive concept.

FIG. 10 is a cross-sectional view of a sub-pixel of a flexible display panel 1000 according to an embodiment of the present inventive concept.

In an embodiment, the flexible display panel 1000 may be an organic light-emitting display device.

In an embodiment, the sub-pixel may include at least one thin film transistor TFT and an organic light-emitting device OLED. Although an example structure of the thin film transistor TFT is illustrated in FIG. 10, the present inventive concept is not limited to the structure of FIG. 10. The structure and the number of the thin film transistor TFTs may be variable.

Referring to the drawing, the flexible display panel 100 includes a display substrate 1011 and a thin film encapsulation layer 1040, which is formed on the display substrate 1011.

The display substrate 1011 may include a flexible glass substrate or a flexible polymer substrate. The display substrate 1011 may be transparent, semitransparent, or translucent.

A barrier film 1012 may be disposed on the display substrate 1011. The barrier film 1012 may cover an entire upper surface of the display substrate 1011. The barrier film 1012 may include a single film or a multilayer film.

The thin film transistor TFT may be disposed on the barrier film 1012. A semiconductor active layer 1013 may be disposed on the barrier film 1012.

A source region 1014 and a drain region 1015 may be disposed on the semiconductor active layer 1013 by doping the semiconductor active layer 1013 with n-type impurity ions or P-type impurity ions. A channel region 1016 is disposed in an area of the semiconductor active layer 1013 between the source region 1014 and the drain region 1015 without doping with impurities.

A gate insulation film 1017 may be deposited on the semiconductor active layer 1013. The gate insulation film 1017 may include an inorganic film. The gate insulation film 1017 may be a single film or a multilayer film.

A gate electrode 1018 may be disposed on an area of the gate insulation film 1017. The gate electrode 1018 may include a metal material having excellent (high) electrical conductivity. The gate electrode 1018 may include a single film or a multilayer film.

An interlayer insulation film 1019 may be disposed on the gate electrode 1018. The interlayer insulation film 1019 may include an inorganic film or an organic film.

A source electrode 1020 and a drain electrode 1021 may be disposed on the interlayer insulation film 1019. In detail, a contact hole (i.e., a contact opening) is formed by selectively removing portions of the gate insulation film 1017 and the interlayer insulation film 1019. Through the contact hole, the source region 1014 may be electrically connected to the source electrode 1020 and the drain region 1015 may be electrically connected to the drain electrode 1021.

A passivation film 1022 may be disposed on the source electrode 1020 and the drain electrode 1021. The passivation film 1022 may include an organic film. A planarization film 1023 may be formed on the passivation film 1022. The planarization film 1023 may include an organic film. In some examples, one of the passivation film 1022 and the planarization film 1023 may be omitted.

The thin film transistor TFT may be electrically connected to the organic light-emitting device OLED.

The organic light-emitting device OLED may be disposed on the planarization film 1023. The organic light-emitting device OLED may include a first electrode 1025, an intermediate layer 1026, and a second electrode 1027.

The first electrode 1025 may function as an anode and may include various suitable conductive elements. The first electrode 1025 may be a transparent electrode or a reflective electrode. For example, when the first electrode 1025 is the transparent electrode, the first electrode 1025 may include a transparent conductive film. When the first electrode 1025 is the reflective electrode, the first electrode 1025 may include a reflective film and a transparent film disposed on the reflective film.

A pixel defining film 1024 may be disposed on the planarization film 1023. The pixel defining film 1024 may cover a portion of the first electrode 1025. The pixel defining film 1024 may define a light-emitting region of each sub-pixel by surrounding an edge of the first electrode 1025. The first electrode 1113 may be patterned in each sub-pixel.

The pixel defining film 1024 may include an organic film. The pixel defining film 1024 may include a single film or a multilayer film.

The intermediate layer 1026 may be disposed on the first electrode 1025, which is exposed by etching an area of the pixel defining film 1024. The intermediate layer 1026 may be formed according to a vacuum deposition method.

The intermediate layer 1026 may include an organic emissive layer.

As an alternative example, the intermediate layer 1026 may include the organic emissive layer and may further include at least one of a hole injection layer (HIL), a hole transport layer (HTL), an electron transport layer (ETL), and an electron injection layer (EIL). However, the present inventive concept is not limited thereto. The intermediate layer 1026 may include the organic emissive layer and further include various suitable functional layers.

The second electrode 1027 may be disposed on the intermediate layer 1026.

The second electrode 1027 may function as a cathode. The second electrode 1027 may include a transparent electrode or a reflective electrode. For example, when the second electrode 1027 is a transparent electrode, the second electrode 1027 may include a metal film and a transparent conductive film formed on the metal layer. When the second electrode 1027 is the reflective electrode, the second electrode 1027 may include a metal film.

In an embodiment, a plurality of sub-pixels may be disposed on the display substrate 1011, and each sub-pixel may realize red, green, blue, or white light. However, the present inventive concept is not limited thereto.

The encapsulation unit 1116 may cover the organic light-emitting device OLED. The encapsulation unit 1116 may include an inorganic film 1041 and an organic film 1042, which are alternately stacked on the organic light-emitting device OLED. For example, the inorganic film 1041 may include a first inorganic film 1043, a second inorganic film 1044, and a third inorganic film 1045. The organic film 1042 may include a first organic film 1046 and a second organic film 1047.

As described above, when winding a flexible display panel according to embodiments of the present inventive concept, exertion of stress on the flexible display panel may be reduced or prevented.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

It will also be understood that when a layer is referred to as being "between" two elements or layers, it can be the only element or layer between the two elements or layers, or one or more intervening elements or layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the terms "use," "using," and "used" may be considered synonymous with the terms "utilize," "utilizing," and "utilized," respectively.

The flexible display device and/or any other relevant devices or components according to embodiments of the present invention may be implemented utilizing any suitable hardware, firmware (e.g. an application-specific integrated circuit), software, or a suitable combination of software, firmware, and hardware. For example, the various components of the flexible display device may be formed on one integrated circuit (IC) chip or on separate IC chips. Further, the various components of the flexible display device may be implemented on a flexible printed circuit film, a tape carrier package (TCP), a printed circuit board (PCB), or formed on a same substrate.

It should be understood that embodiments described herein should be considered in a descriptive sense and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various suitable changes in form and details may be made therein without departing from the spirit and scope as defined by the following claims, and equivalents thereof.

What is claimed is:

1. A flexible display apparatus comprising:
    a flexible display panel configured to wind around a winding axis unit; and
    a cushion unit arranged on the flexible display panel,
    wherein the cushion unit is arranged on a second surface of the flexible display panel facing a circumferential surface of the winding axis unit,
    wherein the flexible display panel has a first surface, on which a display unit is arranged and which is at an outside of the flexible display panel with respect to the circumferential surface of the winding axis unit, and the second surface opposite to the first surface and at an inside of the flexible display panel with respect to the circumferential surface of the winding axis unit,
    wherein the cushion unit comprises a plurality of cushions that are elastic on the flexible display panel in a lengthwise direction corresponding to a winding direction of the flexible display panel, and wherein the plurality of cushions are separated from one another by gaps in the lengthwise direction and contact the flexible display panel in an inactive area of the flexible display panel that is outside and on opposite sides of an active area of the flexible display panel on which the display unit is arranged, the plurality of cushions being arranged only along a length of the flexible display panel extending up to one circumference of the winding axis unit so that a portion of the second surface of the flexible display panel extending past the one circumference of the winding axis unit contacts the first surface of the flexible display panel upon winding around the winding axis unit,
    wherein bottom edges of adjacent cushions of the cushions do not contact each other on the second surface of the flexible display panel,
    wherein the cushion unit comprises a foam type insulation tape, and
    wherein at least one cushion of the cushion unit is in a space between the flexible display panel and the circumferential surface of the winding axis unit.

2. The flexible display apparatus of claim 1,
    wherein the flexible display panel comprises the active area extending in a lengthwise direction of the flexible display panel and the inactive area extending in a widthwise direction of the flexible display panel.

3. The flexible display apparatus of claim 1, wherein the winding axis unit comprises a fixing portion, and
wherein an end of the flexible display panel is configured to be connected to the fixing portion of the winding axis unit.

4. The flexible display apparatus of claim 3, wherein the end of the flexible display panel and the winding axis unit are configured to be connected to each other at a winding start portion of the flexible display panel.

5. The flexible display apparatus of claim 3, wherein the flexible display panel comprises a substrate and an encapsulation layer on the substrate, the encapsulation layer comprising an alternating stack of organic and inorganic films.

* * * * *